(12) United States Patent
Iizuka et al.

(10) Patent No.: US 9,466,461 B2
(45) Date of Patent: Oct. 11, 2016

(54) ROTATION ANGLE MEASURING METHOD OF MULTI-CHARGED PARTICLE BEAM IMAGE, ROTATION ANGLE ADJUSTMENT METHOD OF MULTI-CHARGED PARTICLE BEAM IMAGE, AND MULTI-CHARGED PARTICLE BEAM WRITING APPARATUS

(71) Applicant: NuFlare Technology, Inc., Yokohama-shi (JP)

(72) Inventors: Osamu Iizuka, Yokohama (JP); Kenji Ohtoshi, Kawasaki (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 14/969,069

(22) Filed: Dec. 15, 2015

(65) Prior Publication Data
US 2016/0211111 A1   Jul. 21, 2016

(30) Foreign Application Priority Data

Jan. 19, 2015   (JP) .................................. 2015-007880

(51) Int. Cl.
*H01J 37/22*   (2006.01)
*H01J 37/317*   (2006.01)

(52) U.S. Cl.
CPC .......... *H01J 37/222* (2013.01); *H01J 37/3177* (2013.01); *H01J 2237/0435* (2013.01); *H01J 2237/1505* (2013.01)

(58) Field of Classification Search
USPC .............................................. 250/492.22, 398
See application file for complete search history.

(56) References Cited

U.S. PATENT DOCUMENTS

| | | | |
|---|---|---|---|
| 2009/0001267 A1* | 1/2009 | Enyama ................. | H01J 37/28 250/310 |
| 2011/0204253 A1* | 8/2011 | Platzgummer ......... | B82Y 10/00 250/396 R |
| 2013/0320230 A1* | 12/2013 | Yoshikawa ......... | H01J 37/3177 250/398 |

FOREIGN PATENT DOCUMENTS

JP   2004-165498   6/2004

* cited by examiner

*Primary Examiner* — Kiet T Nguyen
(74) *Attorney, Agent, or Firm* — Oblon, McClelland, Maier & Neustadt, L.L.P.

(57) ABSTRACT

According to one aspect of the present invention, a rotation angle measuring method of a multi-charged particle beam image includes two-dimensionally scanning a mark arranged on a stage in a multi-charged particle beam writing apparatus using, among multi-charged particle beams that can be used for exposure, a plurality of representative beams of which number is smaller than the number of beams constituting the multi-charged particle beams, creating a two-dimensional image of the plurality of representative beams based on signals obtained by two-dimensional scanning, and acquiring a rotation angle of the multi-charged particle beam image using the two-dimensional image.

10 Claims, 10 Drawing Sheets

ROTATION ANGLE MEASURING METHOD OF MULTI-CHARGED PARTICLE BEAM IMAGE, ROTATION ANGLE ADJUSTMENT METHOD OF MULTI-CHARGED PARTICLE BEAM IMAGE, AND MULTI-CHARGED PARTICLE BEAM WRITING APPARATUS

CROSS-REFERENCE TO RELATED APPLICATION

This application is based upon and claims the benefit of priority from Japanese Patent Application No. 2015-007880 filed on Jan. 19, 2015 in Japan, the entire contents of which are incorporated herein by reference.

BACKGROUND OF THE INVENTION

1. Field of the Invention

Embodiments described herein relate generally to a rotation angle measuring method of a multi-charged particle beam image, a rotation angle adjustment method of a multi-charged particle beam image, and a multi-charged particle beam writing apparatus, and for example, relates to a rotation angle measurement based on a rotational shift of a multi-beam image in multi-beam pattern writing and an adjustment technique thereof.

2. Related Art

A lithography technique which leads development of micropatterning of a semiconductor device is a very important process for exclusively generating a pattern in semiconductor manufacturing processes. In recent years, with an increase in integration density of an LSI, a circuit line width required for semiconductor devices is getting smaller year by year. An electron beam pattern writing technique has inherently superior resolution and a mask pattern is written to mask blanks using an electron beam.

For example, a writing apparatus using multiple beams is known. Compared with a case in which one electron beam is used, many beams can be emitted at a time by using multiple beams so that throughput can be improved significantly. In such a writing apparatus of multi-beam mode, for example, an electron beam emitted from an electron gun assembly is passed through a mask having a plurality of holes to form multiple beams, each beam is subjected to blanking control, and each beam that is not shielded is reduced by an optical system to reduce a mask image and deflected by a deflector before being shot at a predetermined position on a target object.

Here, in multi-beam pattern writing, a rotational variation of a whole multi-beam image could arise due to a distortion of the optical system, a displacement of an aperture plate array to form multiple beams from design values, and/or the Coulomb effect. If a rotational variation arises in a multi-beam image, a problem that a written pattern also has a positional displacement or a dimensional displacement arises. Thus, it is very important to measure the rotation angle of a multi-beam image on a target object surface directly affecting positional precision or dimensional precision of a pattern to be written and to adjust the rotation angle using the result thereof. However, the current amount per beam is small in multiple beams and measuring one beam after another increases a measurement error. Further, the number of beams is large and thus, it takes a very long time to adjust one beam after another, which makes it difficult to adjust each beam due to time constraints.

Regarding the measurement of rotational variation (rotation angle), a technique to measure the rotational variation of multiple beams for exposure by forming multiple beams for measurement that are not used for exposure around multiple beams for exposure used for exposure and measuring the position of the multiple beams for measurement is proposed (see Published Unexamined Japanese Patent Application No. 2004-165498, for example).

BRIEF SUMMARY OF THE INVENTION

According to one aspect of the present invention, a rotation angle measuring method of a multi-charged particle beam image includes:

two-dimensionally scanning a mark arranged on a stage in a multi-charged particle beam writing apparatus using, among multi-charged particle beams that can be used for exposure, a plurality of representative beams of which number is smaller than the number of beams constituting the multi-charged particle beams;

creating a two-dimensional image of the plurality of representative beams based on signals obtained by two-dimensional scanning; and acquiring a rotation angle of the multi-charged particle beam image using the two-dimensional image.

According to another aspect of the present invention, a rotation angle adjusting method of a multi-charged particle beam image includes:

two-dimensionally scanning a mark arranged on a stage in a multi-charged particle beam writing apparatus using, among multi-charged particle beams that can be used for exposure, a plurality of representative beams of which number is smaller than the number of beams constituting the multi-charged particle beams;

creating a two-dimensional image of the plurality of representative beams based on signals obtained by two-dimensional scanning;

acquiring a rotation angle of the multi-charged particle beam image using the two-dimensional image; and adjusting the rotation angle of the multi-charged particle beam image by rotating an arrangement angle of a shaping aperture array member that forms each beam of the multi-charged particle beams or rotating the multi-charged particle beam image using a lens such that the rotation angle measured is corrected.

According to further another aspect of the present invention, a multi-charged particle beam writing apparatus includes:

a stage on which a target object is placed and capable of moving continuously;

an emission mechanism that emits a charged particle beam;

a shaping aperture array member, in which a plurality of openings are formed, configured to form multi-beams by making a region including a whole of the plurality of openings be irradiated by the charged particle beam and by making portions of the charged particle beam individually pass through a corresponding one of the plurality of openings;

a blanking aperture array member having a plurality of blankers each that performs blanking control of respective corresponding beam of the multiple beams having passed through the plurality of openings formed in the shaping aperture array member;

a limiting aperture plate member that shields each beam controlled so as to be in a beam OFF state by the plurality of blankers;

a rotation angle calculation processing circuit that calculates a rotation angle of a multi-beam image on a surface of the target object; and a rotation mechanism that rotates the shaping aperture array member such that the rotation angle of the multi-beam image is within tolerance.

DETAILED DESCRIPTION

In the embodiments described below, a method and an apparatus capable of measuring the rotation angle of a multi-beam image using multiple beams for exposure will be described.

In the embodiments described below, the configuration using an electron beam will be described as an example of a charged particle beam. However, the charged particle beam is not limited to an electron beam, and a beam such as an ion beam using charged particles may also be used.

Embodiment 1

Figure 1:
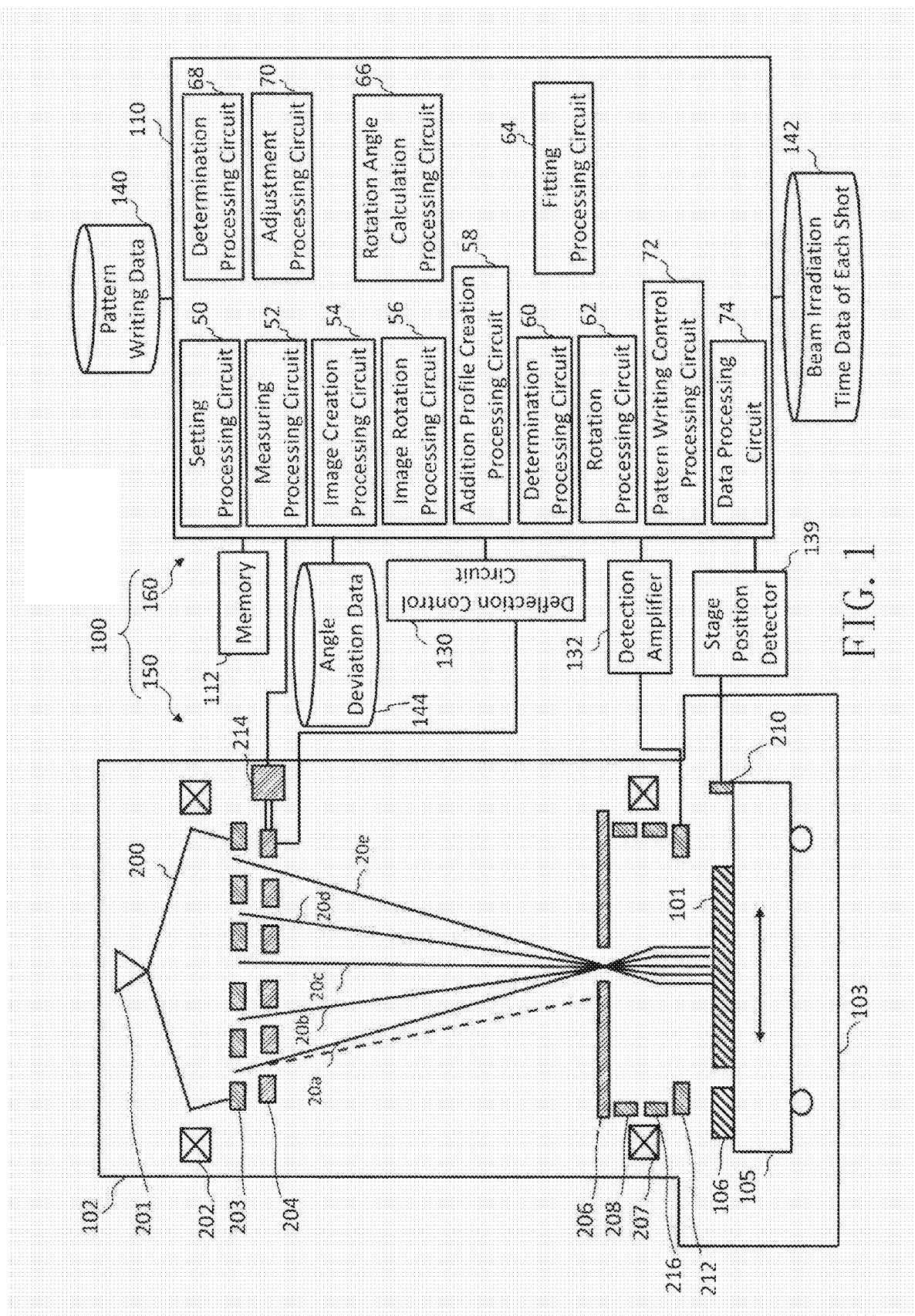
FIG. 1 is a conceptual diagram showing a configuration of a writing apparatus according to Embodiment 1.

FIG. 1 is a conceptual diagram showing a configuration of a writing apparatus according to Embodiment 1; In FIG. 1, a writing apparatus 100 includes a pattern writing mechanism 150 and a control unit 160. The writing apparatus 100 is an example of the multiple charged particle beam writing apparatus. The pattern writing mechanism 150 includes an electron optical column 102 and a pattern writing chamber 103. Inside the electron optical column 102, an electron gun assembly 201, an illumination lens 202, a shaping aperture array member 203, a blanking aperture array member 204, a limiting aperture plate member 206, an objective lens 207, and a deflector 208, a detector 212, a rotation mechanism 214, and an electrostatic lens 216 are arranged. An XY stage 105 is arranged inside the pattern writing chamber 103. A target object 101 such as mask blanks to be a substrate intended for pattern writing while a pattern is written and to which a resist is applied is arranged on the XY stage 105. The target object 101 includes an exposure mask for manufacturing semiconductor devices or a semiconductor substrate (silicon wafer) on which semiconductor devices are manufactured. Further, a mirror 210 for position measurement of the XY stage 105 is arranged on the XY stage 105. Further, a mark 106 is arranged on the XY stage 105. The top surface of the mark 106 is arranged as high as the target object surface (resist surface). Thus, the mark 106 is suitably arranged such that the top surface thereof is adjustable as high as the target object surface. The illumination lens 202 and the objective lens 207 constitute a reducing optical system.

The control unit 160 includes a control computer 110, a memory 112, a deflection control circuit 130, a detection amplifier 132, a stage position detector 139, and storage devices 140, 142, 144 such as magnetic disk drives. The control computer 110, the memory 112, the deflection control circuit 130, the detection amplifier 132, the stage position detector 139, and the storage devices 140, 142, 144 are mutually connected via a bus (not shown). The storage device 140 (data storage unit) stores pattern writing data input from outside the writing apparatus 100.

Inside the control computer 110, a setting processing circuit 50, a measuring processing circuit 52, an image creation processing circuit 54, an image rotation processing circuit 56, an addition profile creation processing circuit 58, a determination processing circuit 60, a rotation processing circuit 62, a fitting processing circuit 64, a rotation angle calculation processing circuit 66, a determination processing circuit 68, an adjustment processing circuit 70, a pattern writing control processing circuit 72, and a data processing circuit 74 are arranged. Each of the setting processing circuit 50, the measuring processing circuit 52, the image creation processing circuit 54, the image rotation processing circuit 56, the addition profile creation processing circuit 58, the determination processing circuit 60, the rotation processing circuit 62, the fitting processing circuit 64, the rotation angle calculation processing circuit 66, the determination processing circuit 68, the adjustment processing circuit 70, the pattern writing control processing circuit 72, and the data processing circuit 74, includes an electric circuit, a quantum circuit, a computer, a processor, a circuit board, or a semiconductor device, for example. Each of the processing circuits may use the common processing circuit (same processing circuitry), or may use different processing circuits (separated processing circuitries). Information input into or output from the setting processing circuit 50, the measuring processing circuit 52, the image creation processing circuit 54, the image rotation processing circuit 56, the addition profile creation processing circuit 58, the determination processing circuit 60, the rotation processing circuit 62, the fitting processing circuit 64, the rotation angle calculation processing circuit 66, the determination processing circuit 68, the adjustment processing circuit 70, the pattern writing control processing circuit 72, and the data processing circuit 74 and information being calculated are stored in the memory 112 each time.

Here, in FIG. 1, only the configuration needed to describe Embodiment 1 is shown. Other configurations normally needed for the writing apparatus 100 may also be included.

Figure 2A:
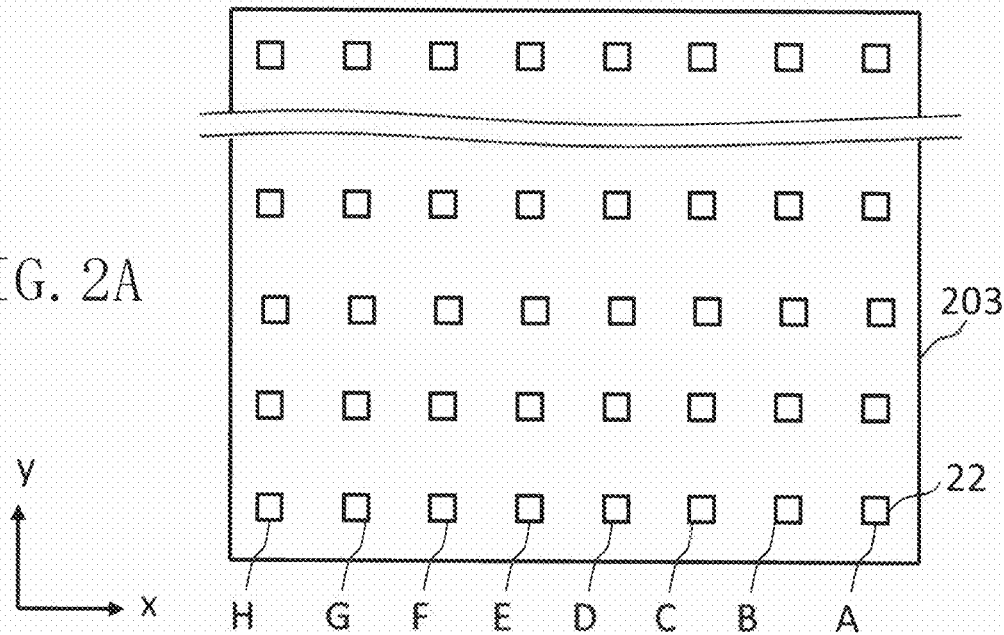
FIGS. 2A and 2B are conceptual diagrams showing a configuration of an aperture plate member according to Embodiment 1.
Figure 2B:
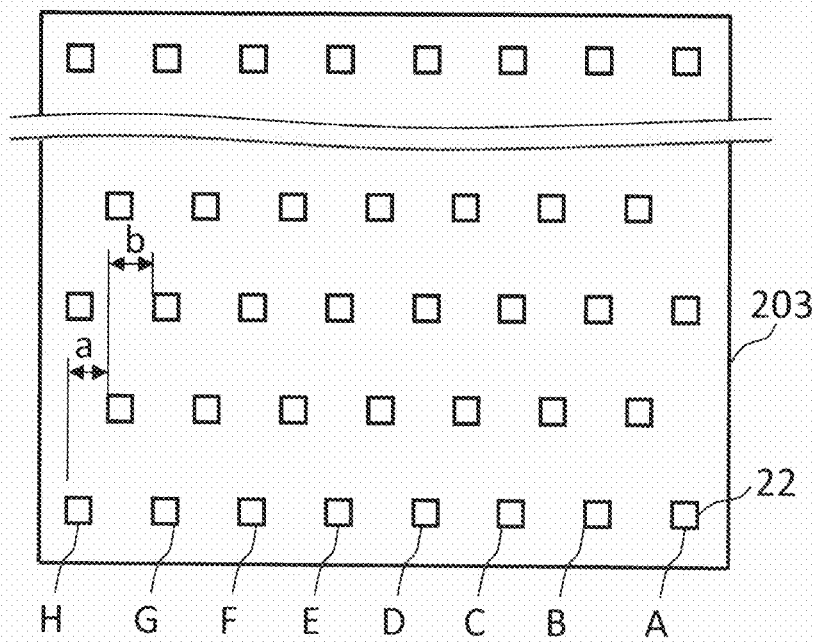

FIGS. 2A and 2B are conceptual diagrams showing the configuration of a shaping aperture array member according to Embodiment 1. In FIG. 2A, the shaping aperture array member 203 has holes (openings) 22 of m' rows high (y direction)×n' rows wide (x direction) (m', n'≥2) formed with predetermined arrangement pitches in a matrix of rows and columns. For example, the 512×512 holes (openings) 22 are arranged. In FIG. 2A, for example, the 512×8 holes 22 are formed. Each of the holes 22 is formed in a rectangular shape of the same dimensions. Alternatively, each of the holes 22 may be formed in a circular shape of the same outside diameter. Here, an example in which the eight holes 22 from A to H are formed in the x direction for each row in the y direction is shown. Multiple beams 20 are formed by a portion of an electron beam 200 being passed through a plurality of these holes 22. Here, an example in which the holes 22 of two rows or more are arranged both vertically and horizontally (x, y directions) is shown, but the present embodiment is not limited to such an example. In addition, for example, a plurality of rows may be arranged vertically or horizontally (x or y direction) and only one row may be arranged in the other direction. Also, the method of arranging the holes 22 is not limited to a case of arranging holes in a grid-like shape like in FIG. 2A. For example, as shown in FIG. 2B, the holes in the first row and the second row in the vertical direction (y direction) may be arranged by being shifted by a dimension a in the horizontal direction (x direction) from each other. Similarly, the holes in the second row and the third row in the vertical direction (y direction) may be arranged by being shifted by a dimension b in the horizontal direction (x direction) from each other.

Figure 3:
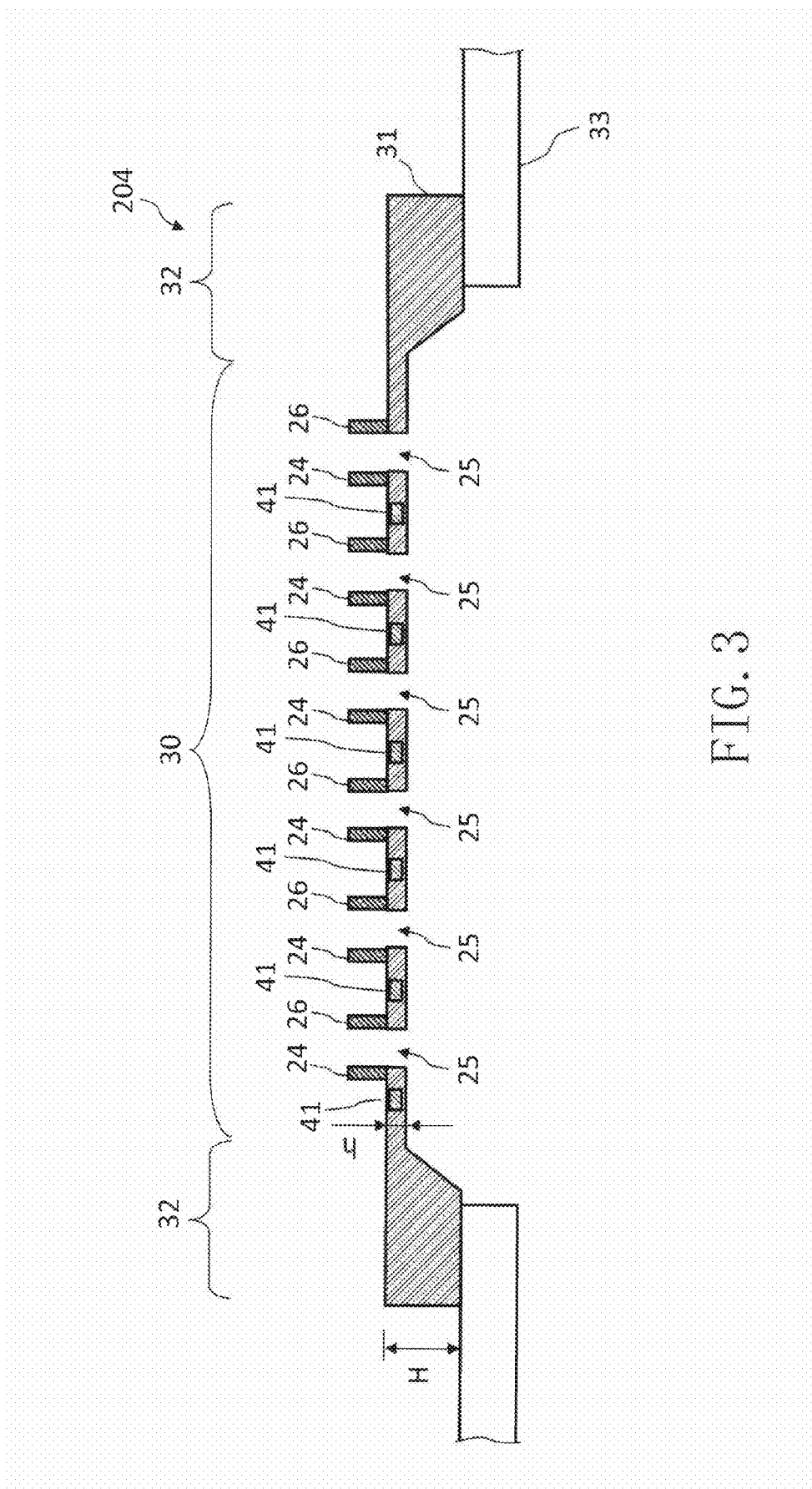
FIG. 3 is a sectional view showing a configuration of a blanking aperture array member according to Embodiment 1.
Figure 4:
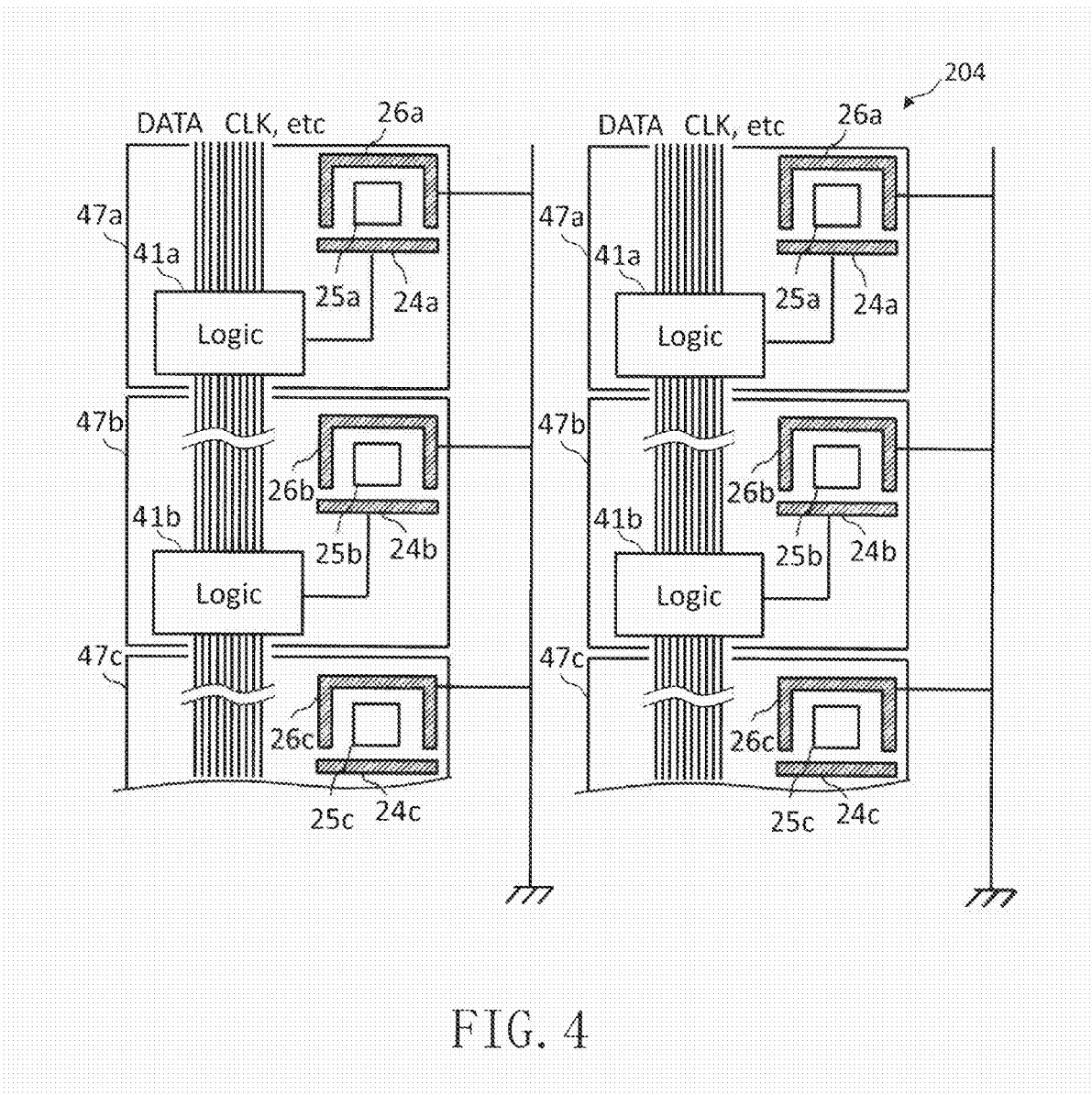
FIG. 4 is a top conceptual diagram showing a portion of a configuration in a membrane region of the blanking aperture array member according to Embodiment 1.

FIG. 3 is a sectional view showing a configuration of a blanking aperture array member according to Embodiment 1; FIG. 4 is a top conceptual diagram showing a portion of a configuration in a membrane region of the blanking aperture array member according to Embodiment 1; In FIGS. 3 and 4, the physical relationship among a control electrode 24, a counter electrode 26, and a control circuit 41 does not correspond to the actual physical relationship. The blanking aperture array member 204 has, as shown in FIG. 3, a semiconductor substrate 31 made of silicon and the like arranged on a fulcrum 33. The center portion of the substrate 31 is, for example, thinly cut from the back side and processed into a membrane region 30 (first region) of a thin thickness h. The periphery surrounding the membrane region 30 is an outer circumferential region 32 (second region) of a thick thickness H. The top surface of the membrane region 30 and the top surface of the outer circumferential region 32 are formed so as to have the same height or substantially the same height. The substrate 31 is held on the fulcrum 33 by the back side of the outer circumferential region 32. The center portion of the fulcrum 33 is open and the membrane region 30 is positioned in a region where the fulcrum 33 is open.

The membrane region 30 has a passing hole 25 (opening) for passing of each beam of multiple beams opened in a position corresponding to each of the holes 22 of the shaping aperture array member 203 shown in FIG. 2A (or 2B). In the example in FIG. 1, a multi-beam image is incident while being reduced by the reducing optical system and the passing hole 25 (opening) is opened fitting to the passing position of each beam. Then, as shown in FIGS. 3 and 4, a pair (blanker: blanking deflector) of the control electrode 24 and the counter electrode 26 for blanking deflection is arranged in the membrane region 30 across the passing hole 25 corresponding to a neighborhood position of each of the passing holes 25. Also, the control circuit 41 (logic circuit) that applies a deflecting voltage to the control electrode 24 for each of the passing holes 25 is arranged in the neighborhood of each of the passing holes 25 in the membrane region 30. The counter electrode 26 for each beam is ground-connected.

Also, as shown in FIG. 4, for example, a 10-bit parallel wire for control signal is connected to each of the control circuits 41. In addition to, for example, the 10-bit parallel wire, a clock signal line and a power wire, respectively for control purpose are connected to each of the control circuits 41. A portion of the parallel wire may be used for the clock signal line or the power wire. An individual blanking mechanism 47 by the control electrode 24, the counter electrode 26, and the control circuit 41 is configured for each beam constituting multiple beams. In the example of FIG. 3, the control electrode 24, the counter electrode 26, and the control circuit 41 are arranged in the membrane region 30 where the thickness of the substrate 31 is thin. However, the present embodiment is not limited to such an example.

The electron beam 20 passing through each of the passing holes 25 is deflected by voltages of the two electrodes 24, 26 forming a pair applied independently. Blanking control is exercised by such deflection. In other words, a pair of the control electrode 24 and the counter electrode 26 deflects by blanking a corresponding beam of multiple beams having passed through a plurality of the holes 22 (openings) of the shaping aperture array member 203.

When a pattern writing process is performed, the data processing circuit 74 reads pattern writing data from the storage device 140 and creates beam irradiation time data showing the dose for each pixel obtained by dividing the pattern writing region of the target object 101 into a predetermined mesh size. The pixel size may be configured as a size equivalent to the beam size of multiple beams or smaller. Then, the beam irradiation time data is stored in the storage device 142. The deflection control circuit 130 reads the beam irradiation time data under the control of the pattern writing control processing circuit 72 and outputs a signal to each of the control circuits 41 of the blanking aperture array member 204. Under the control of the pattern writing control processing circuit 72, the pattern writing mechanism 150 operates as described below.

Next, the operation of the pattern writing mechanism 150 in the writing apparatus 100 will be described. The electron beam 200 emitted from the electron gun assembly 201 (emission mechanism) illuminates the whole shaping aperture array member 203 while being refracted and reduced by the illumination lens 202 constituting one reducing optical system. The shaping aperture array member 203 has a plurality of rectangular holes 22 (openings) formed therein and the electron beam 200 illuminates a region containing all of the plurality of holes 22. A plurality of electron beams (multiple beams) 20a to 20e in, for example, a rectangular shape is formed by a portion of the electron beam 200 with which the positions of the plurality of holes 22 are irradiated being passed through each of the plurality of holes 22 of the shaping aperture array member 203. The multiple beams 20a to 20e pass through the respective corresponding blankers (first deflector: individual blanking mechanism) of the blanking aperture array member 204. Such blankers individually deflect (deflect by blanking) the passing electron beam 20.

The multiple beams 20a to 20e having passed through the blanking aperture array member 204 travel toward a center hole formed in a limiting aperture plate member 206. A crossover (c. o.) is to be formed by the illumination lens 202 on the surface of the limiting aperture plate member 206 or in a position inside the center hole formed in the limiting aperture plate member 206 Here, the electron beam 20 deflected by the blanker of the blanking aperture array member 204 deviates from the position of the hole of the limiting aperture plate member 206 and is shielded by the limiting aperture plate member 206. On the other hand, the electron beam 20 that is not deflected by the blanker of the blanking aperture array member 204 passes, as shown in FIG. 1, through the hole in the center of the limiting aperture plate member 206. The blanking control is exercised by ON/OFF of the individual blanking mechanism to control ON/OFF of a beam. In this manner, the limiting aperture plate member 206 shields each beam deflected so as to be in a beam OFF state by the individual blanking mechanism 47. Then, a beam for one shot is formed for each beam by a beam formed between beam ON and beam OFF and having passed through the limiting aperture plate member 206. The multiple beams 20 having passed through the limiting aperture plate member 206 are focused by the objective lens 207 constituting another reducing optical system to become a pattern image of a desired reduction ratio and each beam (multiple beams 20 as a whole) having passed through the limiting aperture plate member 206 is deflected collectively in the same direction by the deflector 208 and targeted at the irradiation position of each beam on the target object 101. When, for example, the XY stage 105 moves continuously, the irradiation position of a beam is controlled by the deflector 208 so as to track the movement of the XY stage 105. The position of the XY stage 105 is measured by aiming a laser from the stage position detector 139 at the mirror 210 on the XY stage 105 and using a reflected light thereof. The multiple beams 20 emitted at a time are ideally arranged with pitches obtained by multiplying the arrangement pitch of the plurality of holes of the shaping aperture array member 203 by the above desired reduction ratio. The writing apparatus 100 performs a pattern writing operation by the raster scan method by which the multiple beams 20 to be a shot beam are in turn emitted successively pixel by pixel by moving the beam deflection position by the deflector 208 while tracking the movement of the XY stage 105 during each tracking operation. When a desired pattern is written, a needed beam is controlled to beam ON by blanking control in accordance with the pattern.

The pattern writing region of the target object 101 or a chip region into which a pattern is written is divided into stripe regions on a thin rectangle of a predetermined width. Then, each stripe region is virtually divided into a plurality of mesh regions (pixels). The size of the mesh region (pixel) is suitably, for example, a size equal to the beam size or less. For example, the size is suitably set to about 10 nm. The mesh region (pixel) becomes the beam irradiation unit region per beam of multiple beams.

When writing a pattern to the target object 101 using the multiple beams 20, as described above, the multiple beams 20 to be a shot beam are in turn emitted successively pixel by pixel by moving the beam deflection position by the deflector 208 while tracking the movement of the XY stage 105 during tracking operation. Then, which pixel on the target object 101 to irradiate with which beam of multiple beams is determined by a pattern writing sequence. Using beam pitches between beams adjacent in the x and y directions of multiple beams, a region of the beam pitch (x direction)×beam pitch (y direction) between beams adjacent in the x and y directions on the target object 101 surface includes a region (sub-pitch region) of n×n pixels. If, for example, the XY stage 105 moves by the beam pitch (x direction) in the −x direction in one tracking operation, n pixels are written by one beam while shifting the irradiation position in the x direction or the y direction (or a slanting direction). Other n pixels in the region of the same n×n pixels are similarly written by a different beam from the above beam in the next tracking operation. In this manner, all pixels in one region of n×n pixels are written by mutually different beams in n tracking operations, each time n pixels. For other regions of n×n pixels in the irradiation region of multiple beams, similar operations are performed in the same period to similarly write a pattern.

Here, in multi-beam pattern writing, a rotational variation of a whole multi-beam image could arise due to a distortion of the optical system, a displacement of an aperture plate array to form multiple beams from design values, and/or the Coulomb effect. If a rotational variation arises in a multi-beam image, a problem that a written pattern also has a positional displacement or a dimensional displacement arises. Thus, it is very important to measure the rotation angle of a multi-beam image on the target object surface directly affecting positional precision or dimensional precision of a pattern to be written and to adjust the rotation angle using the result thereof. Therefore, in Embodiment 1, as will be described below, the rotation angle (rotational variation) of a multi-beam image is measured and adjustments are made such that the rotational variation of the multi-beam image falls within tolerance thereof.

Figure 5:
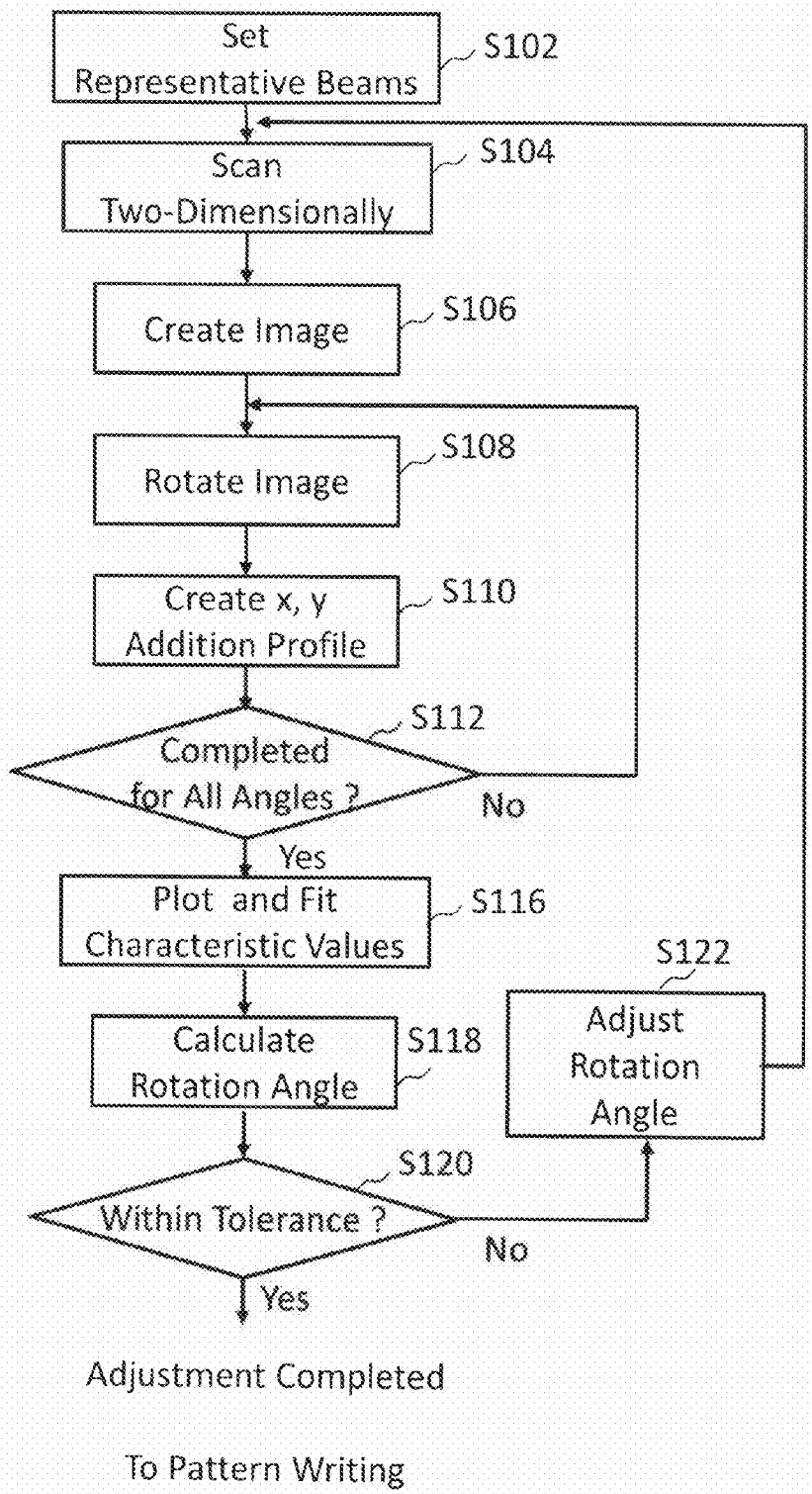
FIG. 5 is a flow chart showing principal processes of a rotation angle adjustment method of a multi-beam image according to Embodiment 1.

FIG. 5 is a flow chart showing principal processes of a rotation angle adjustment method of a multi-beam image according to Embodiment 1; In FIG. 5, a series of processes including a representative beam setting process (S102), a two-dimensional scan process (S104), an image creation process (S106), an image rotation process (S108), an x, y addition profile creation process (S110), a determination process (S112), a characteristic value plot/fitting process (S116), a rotation angle calculation process (S118), a determination process (S120), and a rotation angle adjustment process (S122). Of these processes, processes from the representative beam setting process (S102) to the rotation angle calculation process (S118) correspond to the rotation angle measuring method of a multi-beam image. Also, processes from the image rotation process (S108) to the rotation angle calculation process (S118) correspond to a process to acquire the rotation angle of a multi-beam image.

It is better to measure and adjust the rotation angle of a multi-beam image before the pattern writing process is performed. However, the present embodiment is not limited to the above example and measurement and adjustments may be made while the pattern writing process is performed. The pattern writing process (exposure process) is performed in units of the above stripe region. Therefore, after pattern writing (exposure) of some stripe region is completed, pattern writing (exposure) of the next stripe region may be performed.

As the representative beam setting process (S102), the setting processing circuit 50 sets, among the multiple beams 20 that can be used for exposure (pattern writing), a plurality of representative beams of which number is smaller than the number of beams constituting the multiple beams.

Figure 6:
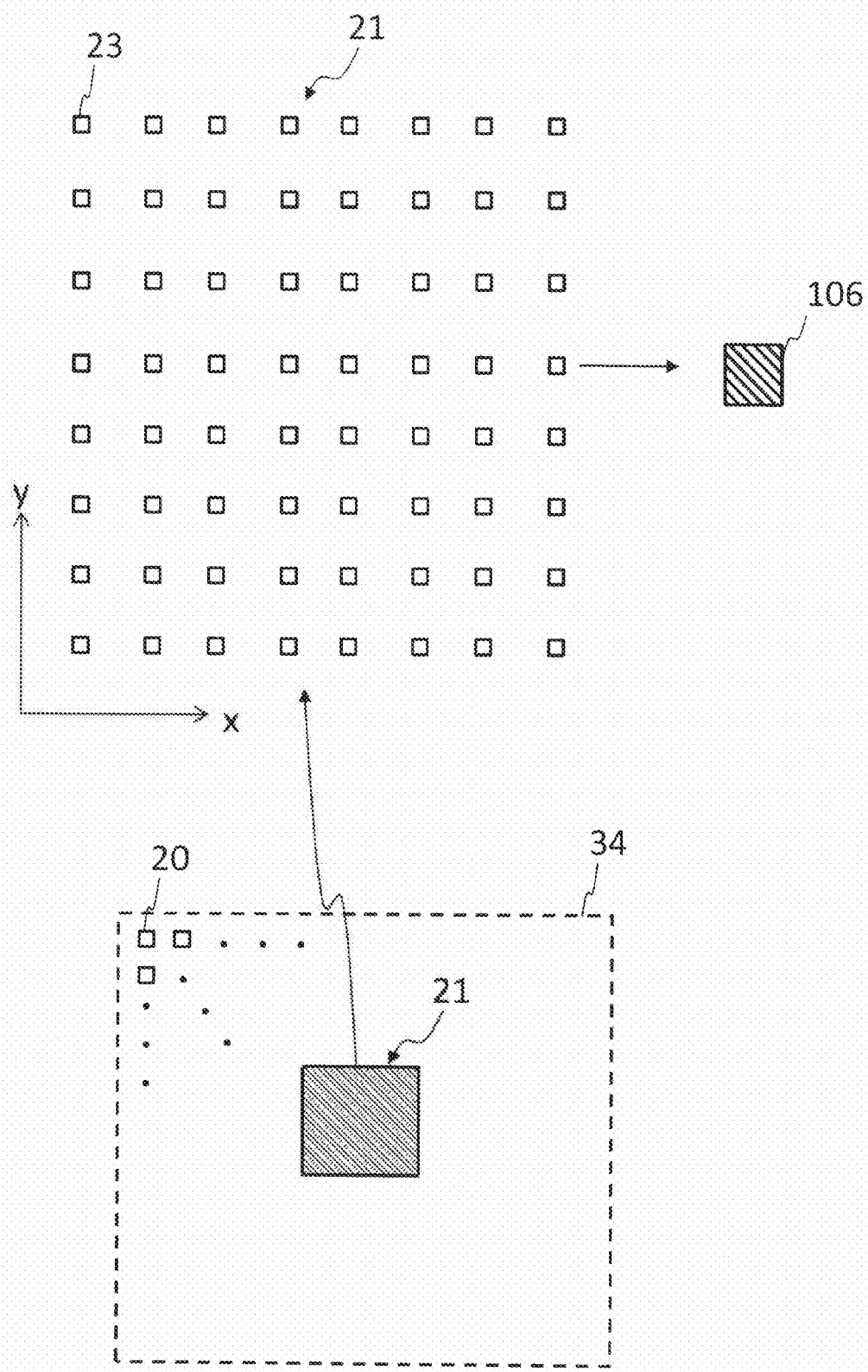
FIG. 6 is a diagram illustrating representative beams and a two-dimensional scan according to Embodiment 1.

FIG. 6 is a diagram illustrating representative beams and a two-dimensional scan according to Embodiment 1; By passing through the shaping aperture array member 203, the m×n multiple beams 20 that can be used for exposure (pattern writing) can be formed. In Embodiment 1, a representative beam group 21 including a plurality of representative beams 23 is set from the m'×n' multiple beams 20. For example, a beam group positioned in a center portion inside a beam irradiation region 34 surrounding the m'×n' multiple beams 20 that can be emitted in one shot is suitably used as the representative beam group 21. Measurement with a small error can be made by using, rather than a beam group of an unbalanced region close to an outer circumferential portion, a beam group around a center position of a multi-beam image to be a rotation axis of a rotational variation of the multi-beam image. The plurality of representative beams 23 includes m rows×n columns (m and n are integers equal to 2 or greater) beams. For example, among 512×512 multiple beams, for example, 8×8 multiple beams are set as the plurality of representative beams 23. The current amount per beam is small and a measurement error increases, but by using a group of 64 beams, the measurement error can be made smaller. If the m'×n' multiple beams 20 that can be used for exposure (pattern writing) are one-dimensional line beams, it is needless to say that one (direction in which a plurality of rows of beam is not present) of m and n may be set to 1.

As the two-dimensional scan process (S104), the measuring processing circuit 52 two-dimensionally scans the mark 106 using the plurality of representative beams 23. As shown in FIG. 6, the mark 106 is configured in a size smaller than the beam pitch. Then, the representative beam group 21 is deflection-moved by, for example, the deflector 208 such that the plurality of representative beams 23 scans all the marks 106. For example, an operation in which the marks 106 are scanned in the x direction and, after moving a distance smaller than the beam pitch in the y direction, the marks 106 are scanned in the x direction again is repeated.

Accordingly, reflected electrons or/and secondary electrons generated by the mark 106 and surroundings of the marks 106 being irradiated with the representative beam group 21 are detected by the detector 212. A detected signal is output to the detection amplifier 132, amplified by the detection amplifier 132, and analog/digital (A/D) converted before being output to the image creation processing circuit 54. During the A/D conversion, the signal strength (for example, 256 gradations) of each pixel of a two-dimensional image can be acquired.

As the image creation process (S106), the image creation processing circuit 54 creates a two-dimensional image of the representative beam group 21 (the plurality of representative beams 23) based on signals obtained by the two-dimensional scan.

Figure 7:
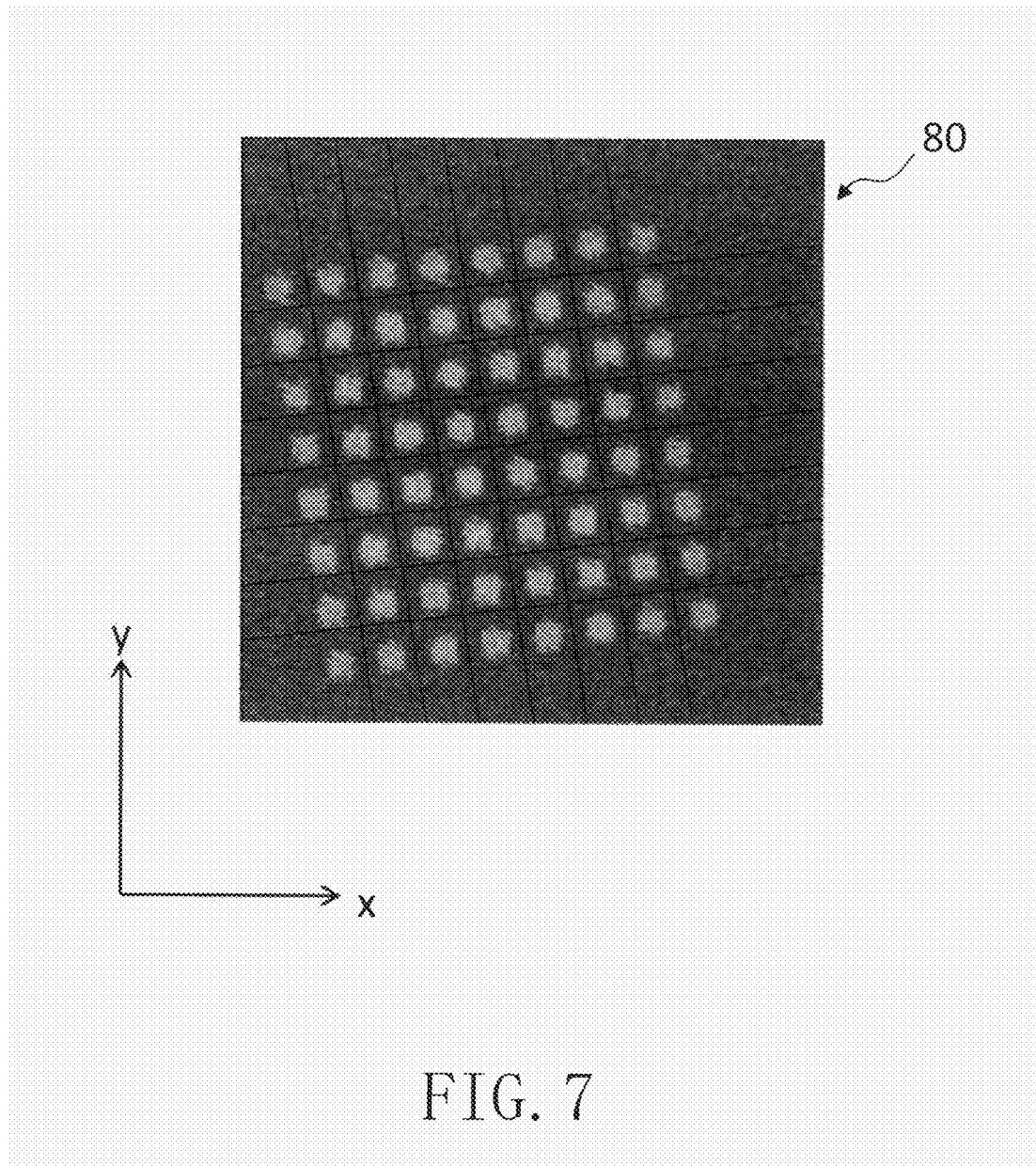
FIG. 7 is a diagram showing an example of a two-dimensional image according to Embodiment 1.

FIG. 7 is a diagram showing an example of a two-dimensional image according to Embodiment 1; Grid lines shown in a two-dimensional image 80 are shown for convenience so that distortions of rows in the x and y directions of the representative beam group 21 can be viewed more easily.

Next, the rotation angle of a multi-beam image is acquired using the created two-dimensional image. A more concrete description will be provided below.

As the image rotation process (S108), the image rotation processing circuit 56 variably rotates the two-dimensional image 80. For example, the image is rotated by the minimum value of the preset rotation angle planned to be varied. For example, if the variable range is from −1 rad to +1 rad, the image is rotated by −1 rad.

As the x, y addition profile creation process (S110), the addition profile creation processing circuit 58 creates an x-direction addition profile obtained by adding x-direction signal strength of the two-dimensional region of each rotation angle while variably rotating the two-dimensional image 80 and a y-direction addition profile obtained by adding y-direction signal strength. In other word, the addition profile creation processing circuit 58 creates an x-direction addition profile obtained by adding x-direction signal strengths of a two-dimensional region, each of which is x-direction signal strength of the two-dimensional region for one of rotation angles while variably rotating the two-dimensional image 80, for each of the rotation angles and a y-direction addition profile obtained by adding y-direction signal strengths of the two-dimensional region, each of which is y-direction signal strength of the two-dimensional region for one of the rotation angles, for the each of the rotation angles.

Figure 8B:
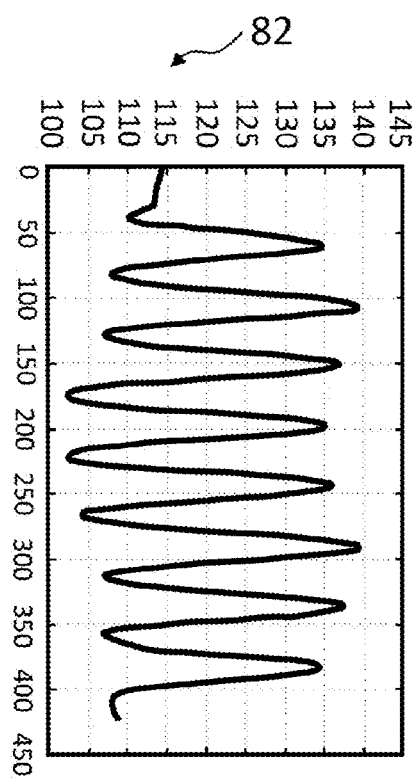
FIGS. 8A to 8C are diagrams showing an example of an x, y-direction addition profile according to Embodiment 1.
Figure 8A:
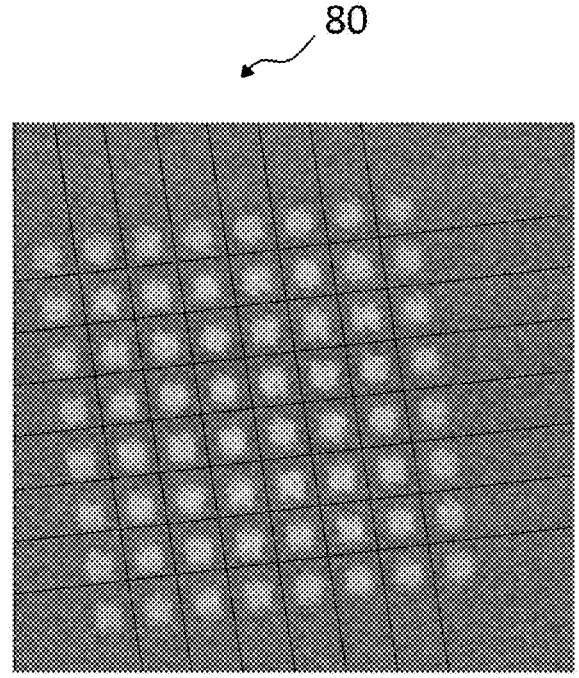
Figure 8C:
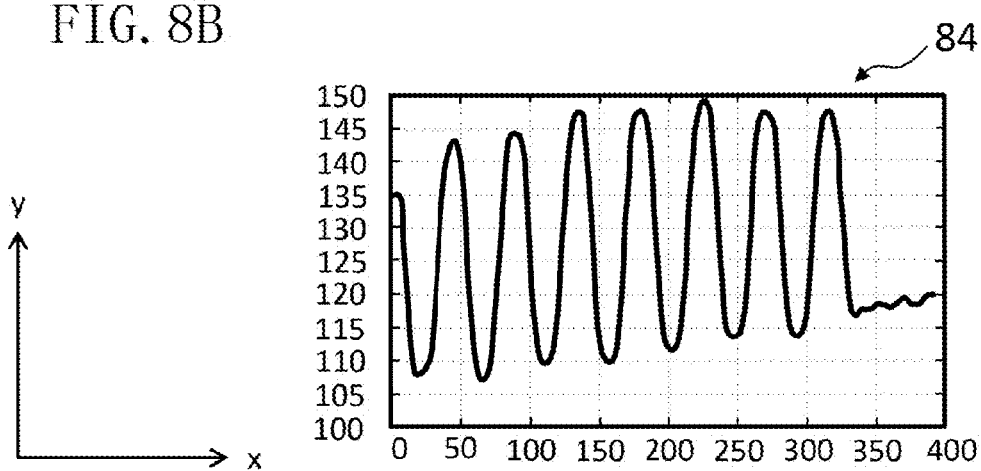

FIGS. 8A to 8C are diagrams showing an example of an x, y-direction addition profile according to Embodiment 1; The two-dimensional image 80 shown in FIG. 7 is shown in FIG. 8A. FIG. 8B shows an addition profile in the direction of grid lines corresponding to the x direction added to the image. FIG. 8C shows an addition profile in the direction of grid lines corresponding to the y direction added to the image. An x-direction addition profile 82 is created as a profile by, as shown in FIG. 8B, cumulatively adding x-direction signal strength of the two-dimensional image 80 and converting values of signal strength after the addition along the y axis direction into a graph. A y-direction addition profile 82 is created as a profile by, as shown in FIG. 8C, cumulatively adding y-direction signal strength of the two-dimensional image 80 and converting values of signal strength after the addition along the x axis direction into a graph. Data of the created x, y-direction addition profiles is stored in the storage device 144.

As the determination process (S112), the determination processing circuit 60 determines whether the x, y addition profile creation process (S110) has been performed for all preset angles planned to be varied. If the process (S110) has been performed for all angles, the process proceeds to the characteristic value plot/fitting process (S116). If the process (S110) has not yet been performed for all angles, the process returns to the image rotation process (S108).

Then, in the image rotation process (S108), the image rotation processing circuit 56 rotates the two-dimensional image 80 by a predetermined sampling angle (for example, 0.01 rad).

Figure 9:
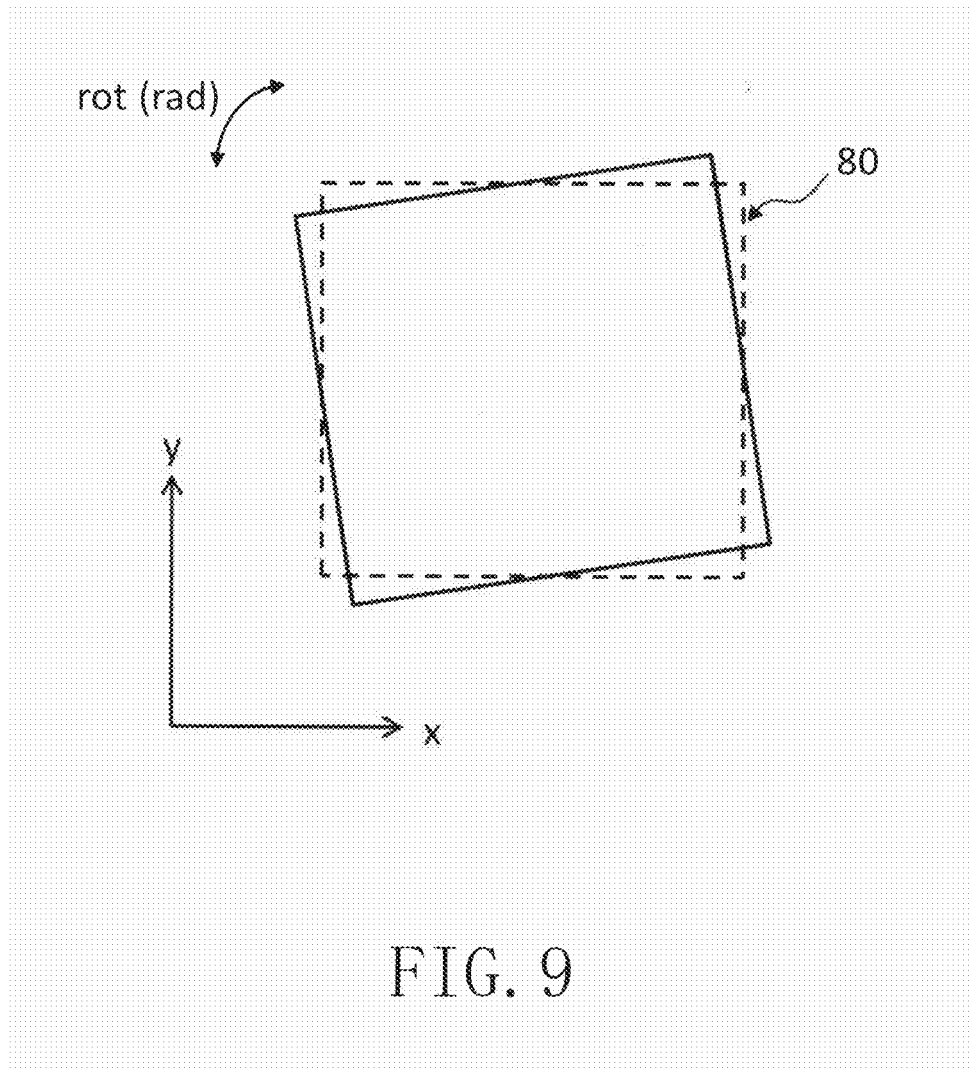
FIG. 9 is a diagram illustrating an image rotation according to Embodiment 1.

FIG. 9 is a diagram illustrating an image rotation according to Embodiment 1; and As shown in FIG. 9, the image rotation processing circuit 56 rotates the two-dimensional image 80 in turn. For example, a rotation angle rot is rotated from −1 rad to +1 rad by a predetermined sampling angle (for example, 0.01 rad) at a time.

Then, each process from the image rotation process (S108) to the determination process (S112) is repeated until the x, y addition profile creation process (S110) is completed for all preset angles planned to be varied in the determination process (S112). Then, in the x, y addition profile creation process (S110), an x-direction addition profile obtained by adding x-direction signal strength in a position of each of the two-dimensional images 80 rotated each time in the image rotation process (S108) and a y-direction addition profile obtained by adding y-direction signal strength are created.

As the characteristic value plot/fitting process (S116), the fitting processing circuit 64 extracts and plots a characteristic value, for example, the maximum value of the x-direction addition profile calculated for each rotation angle of the two-dimensional image. Similarly, the fitting processing circuit 64 extracts and plots a characteristic value, for example, the maximum value of the y-direction addition profile calculated for each rotation angle of the two-dimensional image. Then, each plotted point is fitted to create an approximate line.

Figure 10:
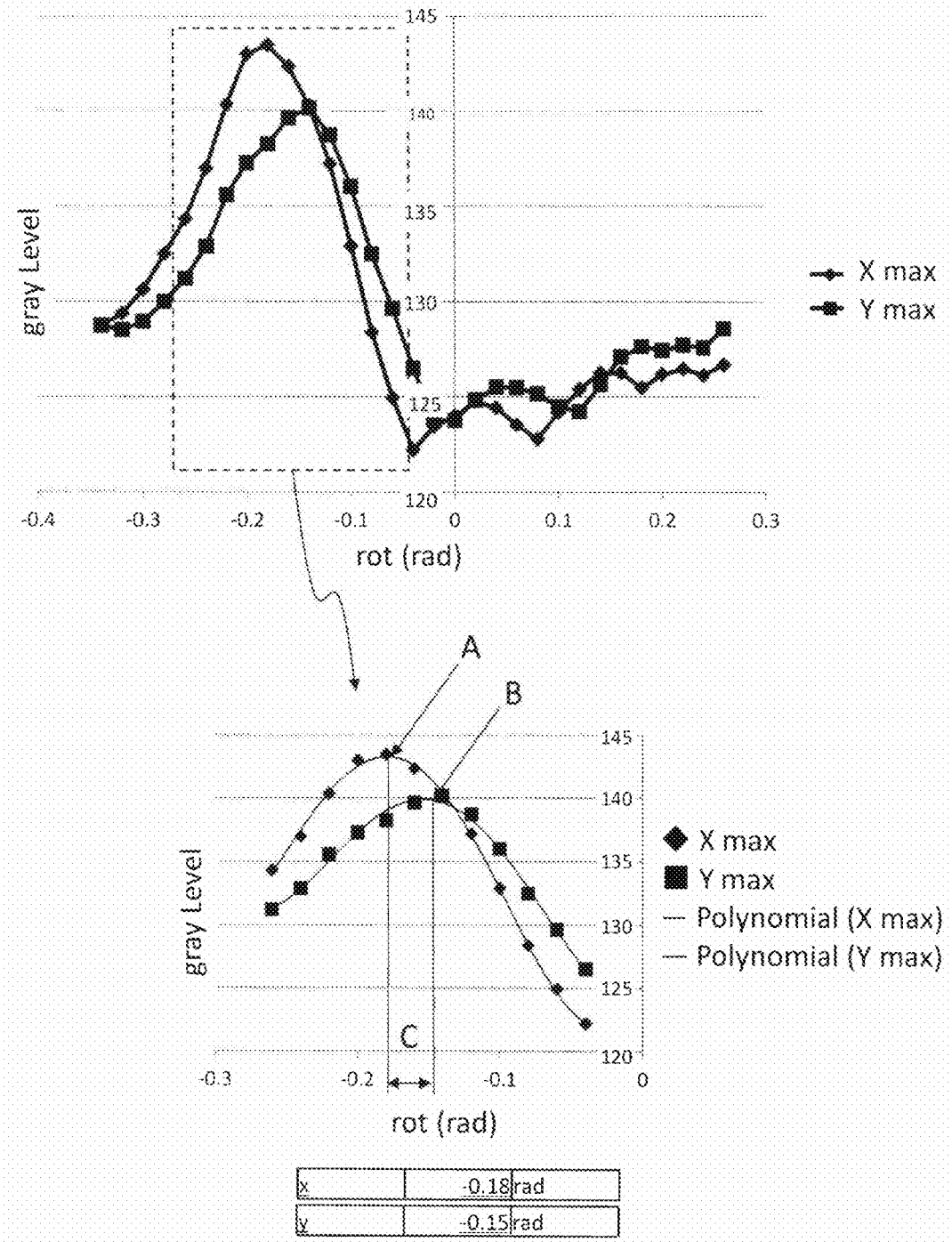
FIG. 10 is a diagram showing the relationship between maximum values of the x, y-direction addition profile and the image rotation angle according to Embodiment 1.

FIG. 10 is a diagram showing the relationship between maximum values of the x, y-direction addition profile and the image rotation angle according to Embodiment 1. In FIG. 10, the vertical axis represents a gradation value of signal strength of the addition profile. The horizontal axis represents the image rotation angle. In the example of FIG. 10, the maximum value of the x-direction addition profile and the maximum value of the y-direction addition profile obtained by rotating the two-dimensional image by, for example, 0.02 rad are plotted and an approximate line is created by fitting data near peaks (maximum values) of a plurality of plotted points. Here, the maximum value is used as the characteristic value, but the present embodiment is not limited to such an example. For example, a reference value of signal strength of an addition profile may be set so that the maximum value of absolute values of differences from the reference value is also suitably used as a characteristic value.

As the rotation angle calculation process (S118), the rotation angle calculation processing circuit 66 calculates (or determines) the x-direction rotation angle (first rotation angle) showing the maximum value of maximum values (characteristic values) of the x-direction addition profile, the characteristic values of the x-direction addition profile being composed of characteristic value of the x-direction addition profile for each of the rotation angles and the y-direction rotation angle (second rotation angle) showing the maximum value of maximum values (characteristic values) of the y-direction addition profile, the characteristic values of the y-direction addition profile being composed of characteristic value of the y-direction addition profile for each of the rotation angles. In the example of FIG. 10, the angle of an A portion to be the maximum value (peak value) of the graph of maximum values of the x-direction addition profile is calculated as the x-direction rotation angle. Here, for example, −0.18 rad is acquired. Similarly, the angle of a B portion to be the maximum value (peak value) of the graph of maximum values of the y-direction addition profile is calculated as the y-direction rotation angle. Here, for example, −0.15 rad is acquired. Also, a difference between the x-direction addition profile and the y-direction addition profile indicated by a C portion is determined as non-perpendicularity.

The rotation angle of a multi-beam image is acquired as described above using a two-dimensional image. Using the acquired rotation angle of the multi-beam image, whether it is necessary to adjust the rotation angle is determined.

As the determination process (S120), the determination processing circuit 68 determines whether the obtained x-direction rotation angel and y-direction rotation angle are both within tolerance. If both are within the tolerance, rotation angle adjustments of the multi-beam image are completed. If both are not within the tolerance, the process proceeds to the rotation angle adjustment process (S122).

As the rotation angle adjustment process (S122), the adjustment processing circuit 70 rotates the arrangement angle of the shaping aperture array member 203 molding each beam of multiple beams so as to correct the measured rotation angle or adjusts the rotation angle of the multi-beam image by rotating the multi-beam image using the electrostatic lens 216 (lens). When the arrangement angle of the shaping aperture array member 203 is rotated, the operation works as described below. The adjustment processing circuit 70 outputs a signal of the rotation angle to be rotated by the rotation mechanism 214. Then, the rotation mechanism 214 rotates the arrangement angle of the shaping aperture array member 203. Accordingly, a multi-beam image to be formed can be rotated. In other words, the rotation mechanism 214 rotates the shaping aperture array member 203 such that the rotation angle of the multi-beam image is within tolerance.

Alternatively, when the electrostatic lens 216 is used, the adjustment processing circuit 70 outputs a signal corresponding to the rotation angle to be rotated to a lens control circuit (not shown). The lens control circuit (not shown) controls the voltage applied to the electrostatic lens 216 to rotate a multi-beam image passing through the electrostatic lens 216.

Alternatively, it is also suitable to rotate the arrangement angle of the shaping aperture array member 203 by a rough angle using the rotation mechanism 214 and also to make fine adjustments of the rotation angle of a multi-beam image using the electrostatic lens 216.

If a shift arises between an x-direction rotation angle and a y-direction rotation angle (non-orthogonal), it is difficult to make adjustments so that the rotation angle is different between the x direction and the y direction and thus, in such a case, the rotation angle is suitably adjusted to an angle between the x-direction rotation angle and the y-direction rotation angle. The adjustment processing circuit 70 calculates, for example, an average value (half the difference between the x-direction rotation angle and the y-direction rotation angle) or a root-mean-square value of the x-direction rotation angle and the y-direction rotation angle to adjust the rotation angle to the obtained angle.

Then, the process returns to the two-dimensional scan process (S104). Then, each process from the two-dimensional scan process (S104) to the rotation angle adjustment process (S122) is repeated until both values of the obtained x-direction rotation angle and y-direction rotation angle are within tolerance in the determination process (S120). Accordingly, the rotation angle of a multi-beam image can be adjusted so that the rotation angle of the multi-beam image is within the tolerance.

According to Embodiment 1, as described above, the rotation angle of a multi-beam image can be measured using multiple beams for exposure (pattern writing). Further, the rotation angle of the multi-beam image can be adjusted (corrected) using the measured rotation angle. Therefore, high-precision pattern writing can be performed.

In the foregoing, the embodiments have been described with reference to concrete examples. However, the present embodiment is not limited to the concrete examples.

In the above examples, a case in which a 10-bit control signal is input for control of each of the control circuits 41 is shown, but the number of bits may appropriately be set. For example, a 2-bit or a 3-bit to 9-bit control signal may be used. Incidentally, an 11-bit control signal or higher may also be used.

Parts of the apparatus configuration, the control method, and the like which are not needed to be explained directly for the explanation of the present invention are not described. However, a necessary apparatus configuration and a necessary control method can be appropriately selected and used. For example, the description of a monitor and other control devices is omitted concerning the controller configuration that controls the writing apparatus 100, but it is needless to say that a necessary controller configuration can be appropriately selected and used.

In addition, all rotation angle measuring methods of a multi-charged particle beam image, all rotation angle adjustment methods of a multi-charged particle beam image, and all multi-charged particle beam writing apparatuses including elements of the present invention and of which design can appropriately be changed by those skilled in the art are included in the scope of the present invention.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A rotation angle measuring method of a multi-charged particle beam image comprising:
   two-dimensionally scanning a mark arranged on a stage in a multi-charged particle beam writing apparatus using, among multi-charged particle beams that can be used for exposure, a plurality of representative beams of which number is smaller than the number of beams constituting the multi-charged particle beams;
   creating a two-dimensional image of the plurality of representative beams based on signals obtained by two-dimensional scanning; and
   acquiring a rotation angle of the multi-charged particle beam image using the two-dimensional image.

2. The method according to claim 1, wherein
   the plurality of representative beams are composed of m rows×n columns (m and n are integers equal to 2 or greater) beams, and
   the acquiring the rotation angle of the multi-charged particle beam image includes
      creating an x-direction addition profile obtained by adding x-direction signal strengths of a two-dimensional region, each of which is x-direction signal strength of the two-dimensional region for one of rotation angles while variably rotating the two-dimensional image, for each of the rotation angles and a y-direction addition profile obtained by adding y-direction signal strengths of the two-dimensional region, each of which is y-direction signal strength of the two-dimensional region for one of for the rotation angles, for the each of the rotation angles, and
      determining a first rotation angle showing a maximum value of characteristic values of the x-direction addition profile, the characteristic values of the x-direction addition profile being composed of characteristic value of the x-direction addition profile for each of the rotation angles and a second rotation angle showing the maximum value of characteristic values of the y-direction addition profile, the characteristic values of the y-direction addition profile being composed of characteristic value of the y-direction addition profile for each of the rotation angles.

3. The method according to claim 2, further comprising: determining whether the x-direction addition profile and the y-direction addition profile have been created for all preset angles planned to be varied.

4. The method according to claim 3, further comprising: when the x-direction addition profile and the y-direction addition profile have not been created for all the angles, rotating the two-dimensional image further by a sampling angle, wherein the x-direction addition profile and the y-direction addition profile at the angle rotated are created.

5. The method according to claim 2, wherein the maximum value of the x-direction addition profile for each of the rotation angles is used as the characteristic value of the x-direction addition profile and the maximum value of the y-direction addition profile for each of the rotation angle is used as the characteristic value of the y-direction addition profile.

6. The method according to claim 2, further comprising: creating an approximate line using the characteristic value of the x-direction addition profile for each of the rotation angles, wherein the first rotation angle uses a peak value of a graph of the approximate line.

7. The method according to claim 1, further comprising: setting, among the multi-charged particle beams that can be used for exposure, the plurality of representative beams of which number is smaller than the number of beams constituting the multi-charged particle beams.

8. A rotation angle adjusting method of a multi-charged particle beam image comprising:
   two-dimensionally scanning a mark arranged on a stage in a multi-charged particle beam writing apparatus using, among multi-charged particle beams that can be used for exposure, a plurality of representative beams of which number is smaller than the number of beams constituting the multi-charged particle beams;
   creating a two-dimensional image of the plurality of representative beams based on signals obtained by two-dimensional scanning;
   acquiring a rotation angle of the multi-charged particle beam image using the two-dimensional image; and
   adjusting the rotation angle of the multi-charged particle beam image by rotating an arrangement angle of a shaping aperture array member that forms each beam of the multi-charged particle beams or rotating the multi-charged particle beam image using a lens such that the rotation angle measured is corrected.

9. The method according to claim 8, wherein when a shift arises between an x-direction rotation angle and a y-direction rotation angle, the rotation angle is adjusted to an angle between the x-direction rotation angle and the y-direction rotation angle.

10. A multi-charged particle beam writing apparatus comprising:
   a stage on which a target object is placed and capable of moving continuously;
   an emission mechanism that emits a charged particle beam;
   a shaping aperture array member, in which a plurality of openings are formed, configured to form multi-beams by making a region including a whole of the plurality of openings be irradiated by the charged particle beam and by making portions of the charged particle beam individually pass through a corresponding one of the plurality of openings;
   a blanking aperture array member having a plurality of blankers each that performs blanking control of respective corresponding beam of the multiple beams having passed through the plurality of openings formed in the shaping aperture array member;
   a limiting aperture plate member that shields each beam controlled so as to be in a beam OFF state by the plurality of blankers;
   a rotation angle calculation processing circuit that calculates a rotation angle of a multi-beam image on a surface of the target object; and
   a rotation mechanism that rotates the shaping aperture array member such that the rotation angle of the multi-beam image is within tolerance.

* * * * *